United States Patent
Iida et al.

(10) Patent No.: US 7,703,662 B2
(45) Date of Patent: Apr. 27, 2010

(54) CONDUCTIVE BALL MOUNTING APPARATUS AND CONDUCTIVE BALL MOUNTING METHOD

(75) Inventors: Kiyoaki Iida, Nagano (JP); Kazuo Tanaka, Nagano (JP); Norio Kondo, Nagano (JP); Hideaki Sakaguchi, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 4 days.

(21) Appl. No.: 12/042,916

(22) Filed: Mar. 5, 2008

(65) Prior Publication Data

US 2008/0217386 A1 Sep. 11, 2008

(30) Foreign Application Priority Data

| Mar. 7, 2007 | (JP) | ............................. 2007-057785 |
| May 24, 2007 | (JP) | ............................. 2007-137939 |
| Feb. 19, 2008 | (JP) | ............................. 2008-037732 |

(51) Int. Cl.
    *B23K 1/00* (2006.01)
    *B23K 3/08* (2006.01)

(52) U.S. Cl. ............................. 228/180.21; 228/180.22; 228/45; 228/43; 228/33; 438/612; 438/613

(58) Field of Classification Search ................. 438/612, 438/613; 228/180.21, 180.22, 45, 43, 33
See application file for complete search history.

(56) References Cited

U.S. PATENT DOCUMENTS 6,533,159 B1   3/2003   Cobbley et al.

2002/0058406 A1*  5/2002  Mukuno et al. ............. 438/626
2002/0105094 A1*  8/2002  Sahara et al. ............... 257/778

FOREIGN PATENT DOCUMENTS

| JP | 64-011071 | 1/1989 |
| JP | 2-102538 | 4/1990 |
| JP | 11-297886 | 10/1999 |
| JP | 2005-044978 | 2/2005 |

OTHER PUBLICATIONS

Dictionary.com; Random House Dictionary; Definition of "spraying".*

* cited by examiner

*Primary Examiner*—Kiley Stoner
*Assistant Examiner*—Erin B Saad
(74) *Attorney, Agent, or Firm*—Drinker Biddle & Reath LLP

(57) ABSTRACT

In a conductive ball mounting apparatus for mounting one conductive ball on each of a plurality of pads which are provided on a substrate and on which an adhesive is formed, the conductive ball mounting apparatus includes: a conductive ball container for containing a plurality of conductive balls therein and having an opening to pass through the plurality of conductive balls; a substrate holder disposed over the conductive ball container to face the opening, and holding the substrate in such a manner that the plurality of conductive balls and the plurality of pads face each other and the substrate is disposed over the conductive ball container with a space therebetween; and a conductive ball supplying unit for supplying the plurality of conductive balls to the plurality of pads via the opening by moving up the plurality of conductive balls.

10 Claims, 15 Drawing Sheets

CONDUCTIVE BALL MOUNTING APPARATUS AND CONDUCTIVE BALL MOUNTING METHOD

This application is based on and claims priority from Japanese Patent Applications No. 2007-057785, filed on Mar. 7, 2007, No. 2007-137939, filed on May 24, 2007, and No. 2008-37732, filed on Feb. 19, 2008, the entire contents of which are hereby incorporated by reference.

BACKGROUND OF THE INVENTION

1. Technical Field

The present disclosure relates to a conductive ball mounting apparatus and a conductive ball mounting method and, more particularly, a conductive ball mounting apparatus and a conductive ball mounting method for mounting conductive balls on a substrate such as a wiring substrate, a wafer, or the like having a plurality of pads on which an adhesive is formed thereon.

2. Background Art

FIG. 1 to FIG. 6 are step views describing a conductive ball mounting method in the related-art.

A conductive ball mounting method in the related-art will be described with reference to FIG. 1 to FIG. 6 hereunder. At first, in steps shown in FIG. 1, a flux 102 is formed on a plurality of pads 101 provided on a substrate 100, and also a resist film 103 is formed on portions of the substrate 100 positioned between a plurality of pads 101.

Then, in steps shown in FIG. 2, the mask 106 having a plurality of openings 106A is fixed on the resist film 103. The openings 106A are formed to expose the pads 101.

Then, in steps shown in FIG. 3, a plurality of conductive balls 108 are disposed on the mask 106. Then, in steps shown in FIG. 4, one conductive ball 108 is mounted on the pads 101 on which the flux 102 is formed respectively by vibrating the substrate 100.

Then, in steps shown in FIG. 5, extra conductive balls 108 that have not been mounted on the pads 101 are removed by sweeping an upper surface of the mask 106 by a squeegee 110. Then, in steps shown in FIG. 6, the mask 106 is removed. Accordingly, the substrate 100 having the conductive balls 108 on the pads 101 is formed (see e.g., JP-A-11-297886).

However, in the method of mounting the conductive ball 108 in the related-art, the step of mounting one conductive ball 108 on the pads 101 on which the flux 102 is formed respectively and the step of removing the extra conductive balls 108 by sweeping an upper surface of the mask 106 by the squeegee 110 are performed separately. Therefore, such a problem existed that it is difficult to improve productivity in the step of mounting the conductive ball 108 on the pads 101 and the step of removing the extra conductive balls 108.

In addition, Japanese Patent Application Publication: JP-A-2-102538 discloses another conductive ball mounting method. In JP-A-2-102538, a conductive layer on which a solder bump is formed is formed on one surface of a circuit substrate and also a solder-flux layer is formed on the one surface of the circuit substrate. Then, a spacer is formed on the solder-flux layer and a mask having openings is formed on the spacer. Next, the circuit substrate is disposed on a solder ball container for accommodating solder balls such that the one surface of the circuit substrate opposes to an opening formed in the solder ball container. Finally, the solder balls are mounted on the circuit substrate by vibrating the solder ball container hard (see FIG. 1 of JP-A-2-102538).

However, in the conductive ball mounting method disclosed in the related-art, rapid vibration is required to mount the solder balls on the openings of the mask. In this case, force caused by the rapid vibration is also applied to the circuit substrate (the mask). Especially, upon using a large substrate, a thin substrate or small balls whose diameter is 100 μm or less, thickness of the mask becomes thin and thus the mask is more likely to vibrate. Therefore, defect such as displacement of the solder balls is generated by vibration of the mask (the circuit substrate).

SUMMARY OF THE INVENTION

One or more exemplary embodiments of the present invention provide a conductive ball mounting apparatus and a conductive ball mounting method that can improve productivity by reducing a processing time required for the step of mounting a conductive ball on a plurality of pads respectively and the step of removing extra conductive balls.

According to one or more aspects of the present invention, a conductive ball mounting apparatus for mounting one conductive ball on each of a plurality of pads which are provided on a substrate and on which an adhesive is formed, the conductive ball mounting apparatus comprises:

a conductive ball container for containing a plurality of conductive balls therein and having an opening to pass through the plurality of conductive balls;

a substrate holder disposed over the conductive ball container to face the opening, and holding the substrate in such a manner that the plurality of conductive balls and the plurality of pads face each other and the substrate is disposed over the conductive ball container with a space therebetween; and a conductive ball supplying unit for supplying the plurality of conductive balls to the plurality of pads via the opening by moving up the plurality of conductive balls.

According to the present invention, the extra conductive balls, which are not disposed on the pads on which the adhesive is formed, out of the plurality of moved-up conductive balls fall down on the conductive ball container. Therefore, the step of mounting the conductive ball on the plurality of pads respectively and the step of removing extra conductive balls can be carried out simultaneously. As a result, a processing time required for the step of mounting the conductive ball on the plurality of pads respectively and the step of removing the extra conductive balls can be shortened, and thus productivity can be improved.

According to one or more aspects of the present invention, a conductive ball mounting apparatus for mounting one conductive ball on each of a plurality of pads which are provided on a substrate and on which an adhesive is formed, the conductive ball mounting apparatus comprises:

a conductive ball for container for containing a plurality of conductive balls therein and having an opening to pass through the plurality of conductive balls;

a substrate holder for holding the substrate such that the plurality of conductive balls and the plurality of pads face each other in a direction perpendicular to a gravity direction; and a conductive ball supplying unit for supplying the plurality of conductive balls to the plurality of pads by spraying the plurality of conductive balls.

According to the present invention, the extra conductive balls, which are not disposed on the pads on which the adhesive is formed respectively, out of the plurality of conductive balls sprayed to the plurality of pads fall down in the gravity direction. Therefore, the step of mounting the conductive ball on the plurality of pads respectively and the step of removing the extra conductive balls can be performed at the same time. As a result, a processing time required for the step of mounting the conductive ball on the plurality of pads respectively and the step of removing the extra conductive balls can be shortened, and productivity can be improved.

According to one or more aspects of the present invention, a mask may have a plurality of through portions corresponding to positions where the plurality of pads are formed, and the mask may be provided to the substrate such that each of the pads is exposed from the plurality of through portions, and a diameter of the through portions may be set to a size capable of passing only one conductive ball.

Therefore, it can be prevented that the plurality of conductive balls are mounted on one pad.

According to one or more aspects of the present invention, the conductive ball mounting apparatus further comprises:

a potential difference generating unit for generating a potential difference between the plurality of conductive balls contained in the conductive ball container and the substrate.

Therefore, the plurality of moved-up conductive balls supplied by the conductive ball supplying unit are attracted to the substrate by an electrical attractive force. As a result, a processing time in the step of mounting one conductive ball on a plurality of pads respectively can be shortened.

According to one or more aspects of the present invention, the conductive ball mounting apparatus further comprises:

a charging unit for charging the mask up to a potential that is substantially equal to a potential of the plurality of conductive balls contained in conductive ball container.

Therefore, the plurality of raised conductive balls are attracted to the pads by an electrical attractive force. As a result, a processing time in the step of mounting the conductive ball on the plurality of pads respectively can be further shortened.

According to one or more aspects of the present invention, the conductive ball mounting apparatus further comprises:

a conductive ball recovering container for recovering extra conductive balls that are not disposed on the pads and fall down in the gravity direction, the conductive ball recovering container being disposed below the substrate in the gravity direction.

According to one or more aspects of the present invention, a method for mounting one conductive ball on each of a plurality of pads which are provided on a substrate and on which an adhesive is formed, the method comprises the successive steps of:

(a) disposing the substrate over a conductive ball container for containing the plurality of conductive balls therein with a space therebetween such that the plurality of conductive balls and the plurality of pads face each other; and (b) supplying the plurality of conductive balls to the plurality of pads by moving up the plurality of conductive balls.

According to the present invention, the extra conductive balls, which are not disposed on the pads on which the adhesive is formed, out of the plurality of moved-up conductive balls fall down on the conductive ball container. Therefore, the step of mounting the conductive ball on the plurality of pads respectively and the step of removing extra conductive balls can be carried out at the same time. As a result, a processing time required for the step of mounting the conductive ball on the plurality of pads respectively and the step of removing the extra conductive balls can be shortened, and thus productivity can be improved.

According to one or more aspects of the present invention, a method for mounting one conductive ball on each of a plurality of pads which are provided on a substrate and on which an adhesive is formed, the method comprises the successive steps of:

(a) disposing the substrate such that a plurality of conductive balls and the plurality of pads face each other in a direction perpendicular to a gravity direction; and (b) supplying the plurality of conductive balls to the plurality of pads by spraying the plurality of conductive balls.

According to the present invention, the extra conductive balls, which are not disposed on the pads on which the adhesive is formed respectively, out of the plurality of conductive balls sprayed to the mask fall in the gravity direction. Therefore, the step of mounting the conductive ball on the plurality of pads respectively and the step of removing the extra conductive balls can be performed simultaneously. As a result, a processing time required for the step of mounting the conductive ball on the plurality of pads respectively and the step of removing the extra conductive balls can be shortened, and productivity can be improved.

According to one or more aspects of the present invention, the method further comprises:

(c) providing a mask having a plurality of through portions corresponding to positions where a plurality of pads are formed, before step (a).

According to one or more aspects of the present invention, the method further comprises:

(d) providing a mask having a plurality of through portions such that the mask covers an opening of a conductive ball container where the plurality of conductive balls are contained, before step (a).

According to one or more aspects of the present invention, the method further comprises:

(e) generating a potential difference between the plurality of conductive balls contained in the conductive ball container and the substrate, between step (a) and step (b).

Therefore, the plurality of conductive balls are attracted to the substrate by an electrical attractive force. As a result, a processing time in the step of mounting one conductive ball on the plurality of pads respectively can be shortened.

According to one or more aspects of the present invention, the method further comprises:

(f) charging the mask up to a potential that is substantially equal to a potential of the plurality of conductive balls contained in the conductive ball container, between step (a) and step (b).

Therefore, the plurality of conductive balls are attracted to the pads by an electrical attractive force. As a result, a processing time in the step of mounting the conductive ball on the plurality of pads respectively can be further shortened.

According to one or more exemplary embodiments of the present invention, productivity can be improved by reducing a processing time in the step of mounting conductive balls on a plurality of pads and the step of removing extra conductive balls.

According to one or more exemplary embodiments of the present invention, the substrate is disposed over the conductive ball container with a space therebetween, so that defect such as displacement of solder balls can be suppressed.

Other aspects and advantages of the invention will be apparent from the following description, the drawings and the claims.

DETAILED DESCRIPTION

Exemplary embodiments of the present invention will be described with reference to the drawings hereinafter.

First Embodiment

Figure 1:
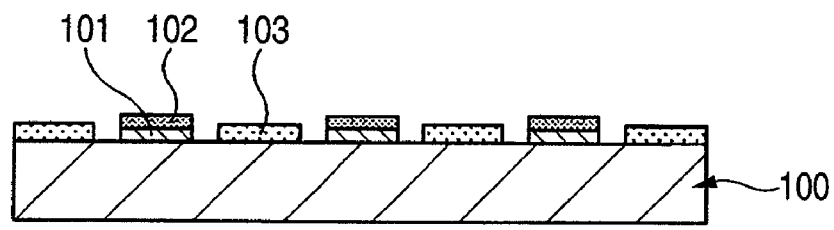
FIG. 1 is a step view (#1) describing a conductive ball mounting method in the related-art.
Figure 2:
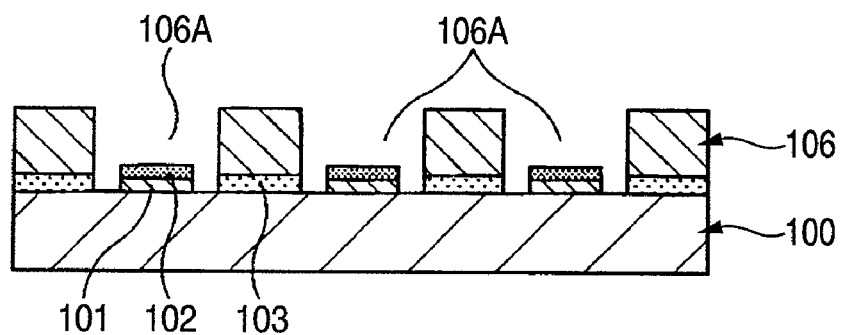
FIG. 2 is a step view (#2) describing the conductive ball mounting method in the related-art.
Figure 3:
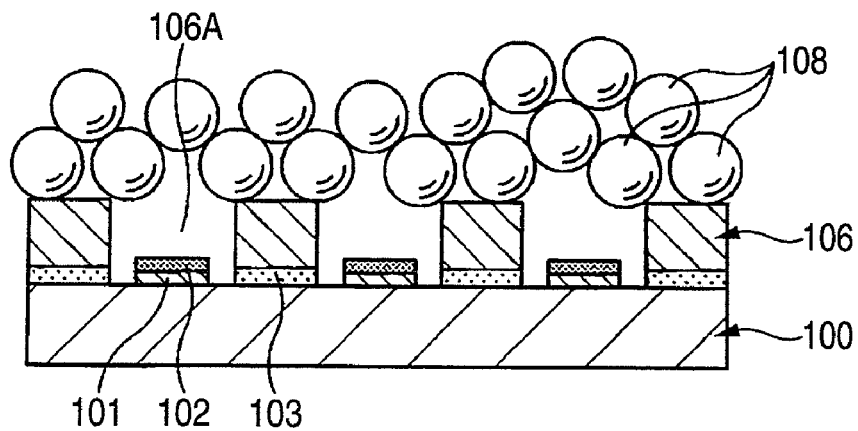
FIG. 3 is a step view (#3) describing the conductive ball mounting method in the related-art.
Figure 4:
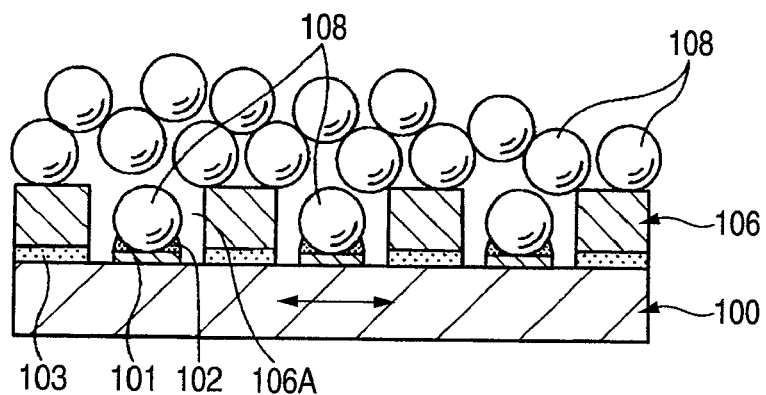
FIG. 4 is a step view (#4) describing the conductive ball mounting method in the related-art.
Figure 5:
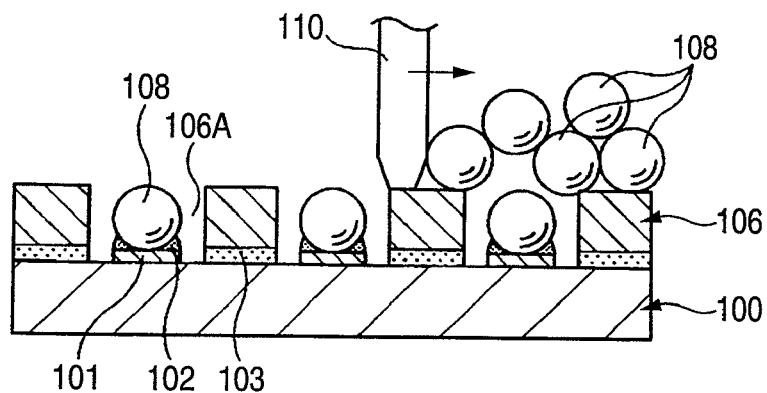
FIG. 5 is a step view (#5) describing the conductive ball mounting method in the related-art.
Figure 6:
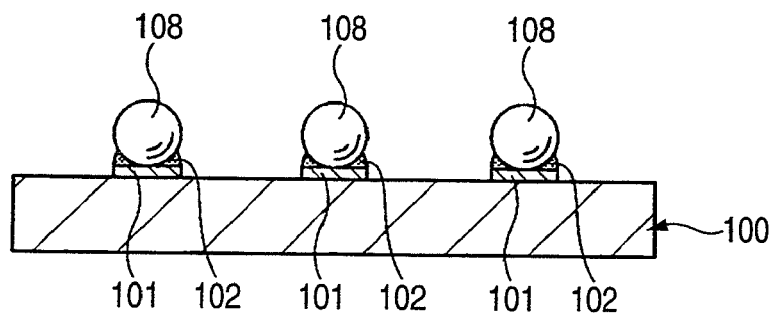
FIG. 6 is a step view (#6) describing the conductive ball mounting method in the related-art.
Figure 7:
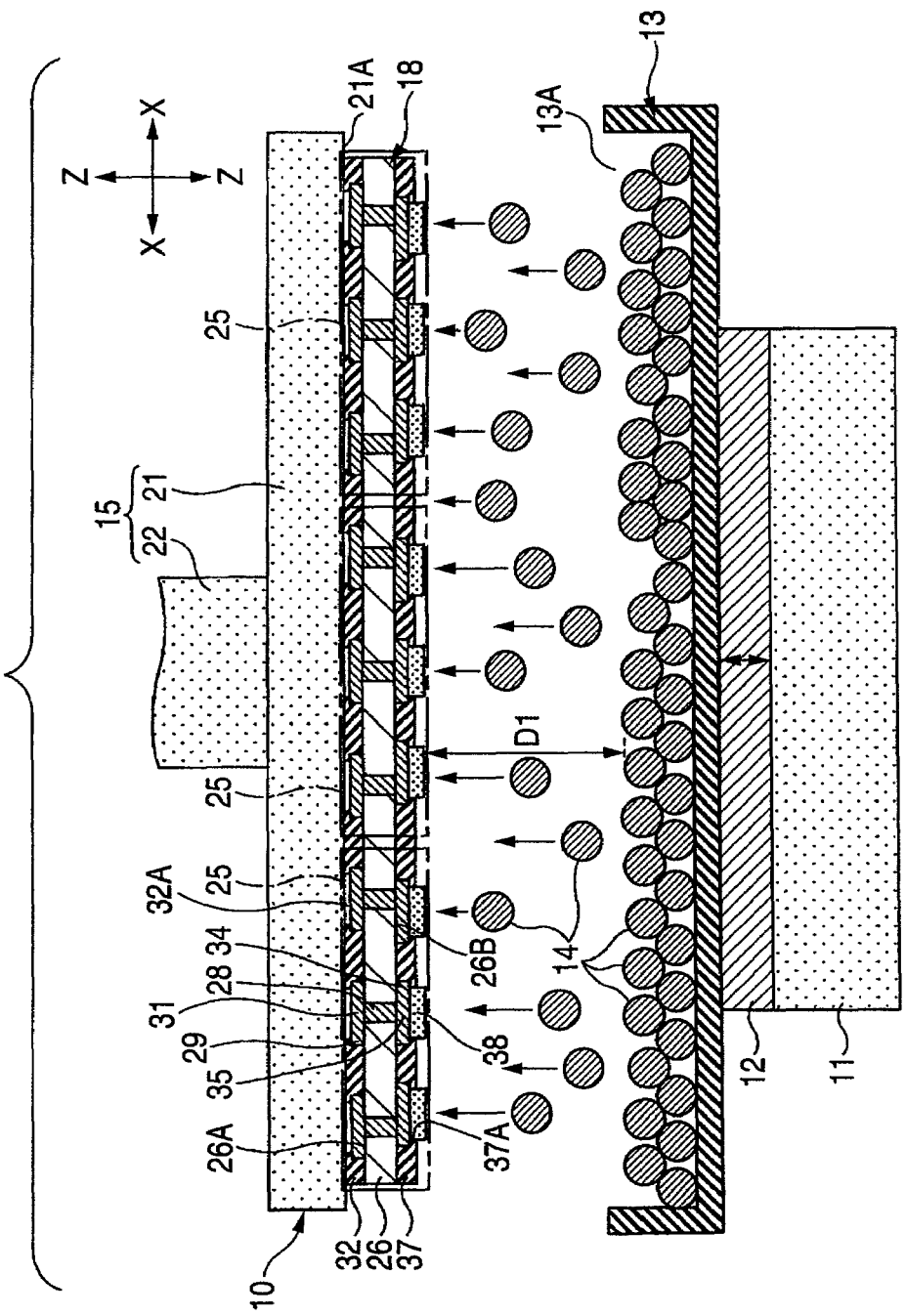
FIG. 7 is a sectional view of a conductive ball mounting apparatus according to a first embodiment of the present invention.

FIG. 7 is a sectional view of a conductive ball mounting apparatus according to a first embodiment of the present invention. In FIG. 7, such a situation is illustrated that a plurality of conductive balls 14 are caused to move up the lower side of a substrate 18 held by a substrate holder 15. Also, in FIG. 7, Z direction denotes the vertical direction, and X direction denotes the direction that intersects orthogonally with the Z direction.

By reference to FIG. 7, a conductive ball mounting apparatus 10 of the first embodiment includes a stage 11, a vibrating unit 12 as a conductive ball supplying unit, a conductive ball container 13, a plurality of conductive balls 14, and the substrate holder 15 for holding the substrate 18.

At first, for brief description, a structure of the substrate 18 held by the substrate holder 15 will be described hereunder. The substrate 18 is constructed such that a plurality of substrates 25 are formed on a plate-like substrate main body 26. That is, the substrate 18 is an aggregate of the plurality of substrates 25 prior to diving into individual pieces. As the substrate main body 26, a glass epoxy resin may be used.

The substrate 25 has the substrate main body 26, through vias 28, upper wirings 29, pads 31, 35, solder resists 32, 37, lower wirings 34, and adhesives 38. The through via 28 is provided to pass through the substrate main body 26. An upper end portion of the through via 28 is connected to the pad 31, and a lower end portion of the through via 28 is connected to the pad 35.

The upper wirings 29 are provided on an upper surface 26A of the substrate main body 26. The upper wirings 29 are connected to the pads 31. The pads 31 are provided on portions, which correspond to positions where the through via 28 is formed, of the upper surface 26A of the substrate main body 26. The pad 31 is connected to the through vias 28 respectively. The pads 31 are provided to mount an electronic component (e.g., a passive component, or the like). The solder resist 32 is provided on the upper surface 26A of the substrate main body 26 to cover the upper wirings 29. The solder resist 32 has openings 32A to expose the pads 31.

The lower wirings 34 are provided on a lower surface 26B of the substrate main body 26. The lower wirings 34 are connected to the pads 35. The pads 35 are provided on portions, which correspond to positions where the through via 28 is formed, of the lower surface 26B of the substrate main body 26. The pad 35 is connected to the through vias 28 respectively. The pads 35 are connected electrically to the pads 31 via the through vias 28. One conductive ball 14 serving as an external connection terminal of the substrate 25 is provided on the pad 35 via the adhesive 38.

The solder resist 37 is provided on the lower surface 26B of the substrate main body 26 to cover the lower wirings 34. The solder resist 37 has openings 37A to expose the pads 35. The adhesive 38 is provided on the pads 35 to fill the openings 37A. The adhesive 38 is used to temporarily fix the conductive balls 14 that are caused to move up when the vibrating unit 12 vibrates the conductive ball container 13. As the adhesive 38, the flux, the solder paste may be used.

The substrate 18 constructed as above is held by the substrate holder 15 such that a plurality of pads 35 on which the adhesive 38 is formed respectively are opposed to a plurality of conductive balls 14 exposed from openings 13A.

The stage 11 supports the conductive ball container 13 via the vibrating unit 12. The vibrating unit 12 is provided on the stage 11. The vibrating unit 12 vibrates the conductive ball container 13 containing a plurality of conductive balls 14 to move up the plurality of conductive balls 14, and thus supplies the plurality of conductive balls 14 to the substrate 18 arranged over the conductive ball container 13.

Since such the vibrating unit 12 moves up the plurality of conductive balls 14 from the lower side of the substrate 18, extra conductive balls 14, which are not disposed on the pads 35 on which the adhesive 38 is formed, out of the plurality of moved up conductive balls 14 fall down on the conductive ball container 13. Therefore, the step of mounting the conductive ball 14 on the plurality of pads 35 respectively and the step of removing extra conductive balls 14 can be performed at the same time. As a result, a processing time required for the step of mounting the conductive ball 14 on the plurality of pads 35 respectively and the step of removing the extra conductive balls 14 can be shortened, and productivity can be improved.

The conductive ball container 13 is provided to contain the plurality of conductive balls 14. The opening 13A for passing the plurality of conductive balls 14 moved up by the vibrating unit 12 through there is formed on the upper end portion of the conductive ball container 13. The plurality of conductive balls 14 passing through the conductive ball container 13 reach the substrate 18 and are disposed on the pads 35 on which the adhesive 38 is formed respectively. As the material of the conductive ball container 13, a metal may be used.

A plurality of conductive balls 14 are contained in the conductive ball container 13. The conductive balls 14 act as the external connection terminals of the substrate 25. As the conductive ball 14, a solder ball may be used. Also, when the solder ball is used as the conductive ball 14, a diameter of the conductive ball 14 may be set to 10 μm to 100 μm, for example.

The substrate holder 15 is disposed over the conductive ball container 13. The substrate holder 15 has a substrate holding portion 21, and a support 22. The substrate holding portion 21 is disposed such that its lower surface 21A faces the opening 13A of the conductive ball container 13. The substrate holding portion 21 is formed into a plate shape. The substrate holding portion 21 holds the substrate 18 on its lower surface 21A. As the method of holding the substrate 18, suction, mechanical holding (e.g., clamping) may be used. Also, a distance D1 between the adhesives 38 of the substrate 18 held by the substrate holding portion 21 and the plurality of conductive balls 14 contained in the conductive ball container 13 may be set to 1 mm, for example. The support 22 is provided to support the substrate holding portion 21.

According to the present embodiment, the conductive ball mounting apparatus includes: the conductive ball container 13 for containing a plurality of conductive balls 14 therein and also having the opening 13A to supply the plurality of conductive balls 14; the substrate holder 15 disposed over the conductive ball container 13 to face the opening 13A and for holding the substrate 18 such that a plurality of conductive balls 14 and a plurality of pads 35 are opposed to each other; and the vibrating unit 12 for moving up the plurality of conductive balls 14. Thus, the extra conductive balls 14, which are not disposed on the pads 35 on which the adhesive 38 is formed, out of the plurality of moved-up conductive balls 14 fall down on the conductive ball container 13. Therefore, the step of mounting the conductive ball 14 on the plurality of pads 35 respectively and the step of removing extra conductive balls 14 may be carried out simultaneously. As a result, a processing time required for the step of mounting the conductive ball 14 on the plurality of pads 35 respectively and the step of removing the extra conductive balls 14 can be shortened, and thus productivity can be improved.

FIG. 8 to FIG. 14 are step views describing a conductive ball mounting method using the conductive ball mounting apparatus according to the first embodiment of the present invention. In FIG. 8 to FIG. 14, the same reference symbols are denoted to the same constituent portions as the configuration shown in FIG. 7. Also, in FIG. 8, FIG. 13, and FIG. 14, "A" denotes a position where the substrate 18 is divided into individual pieces (referred to as a "cut position A" hereinafter).

The method of mounting the conductive balls 14 using the conductive ball mounting apparatus 10 according to the first embodiment of the present invention will be described with reference to FIG. 8 to FIG. 14 hereunder.

Figure 8:
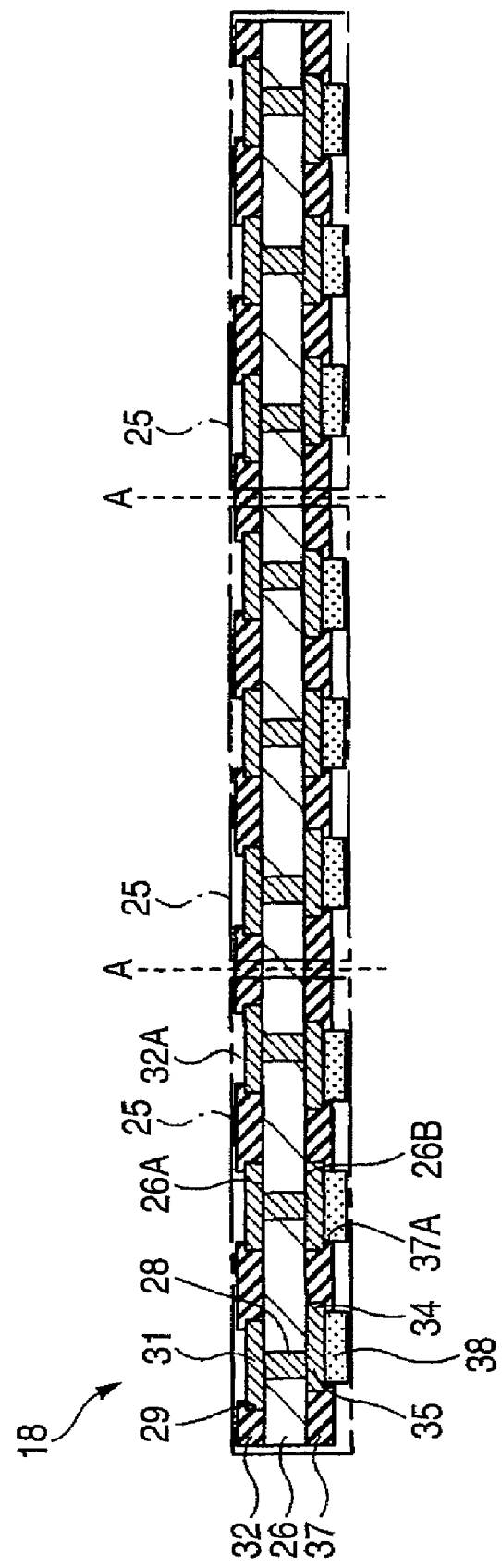
FIG. 8 is a step view (#1) describing a conductive ball mounting method using the conductive ball mounting apparatus according to the first embodiment of the present invention.
Figure 9:
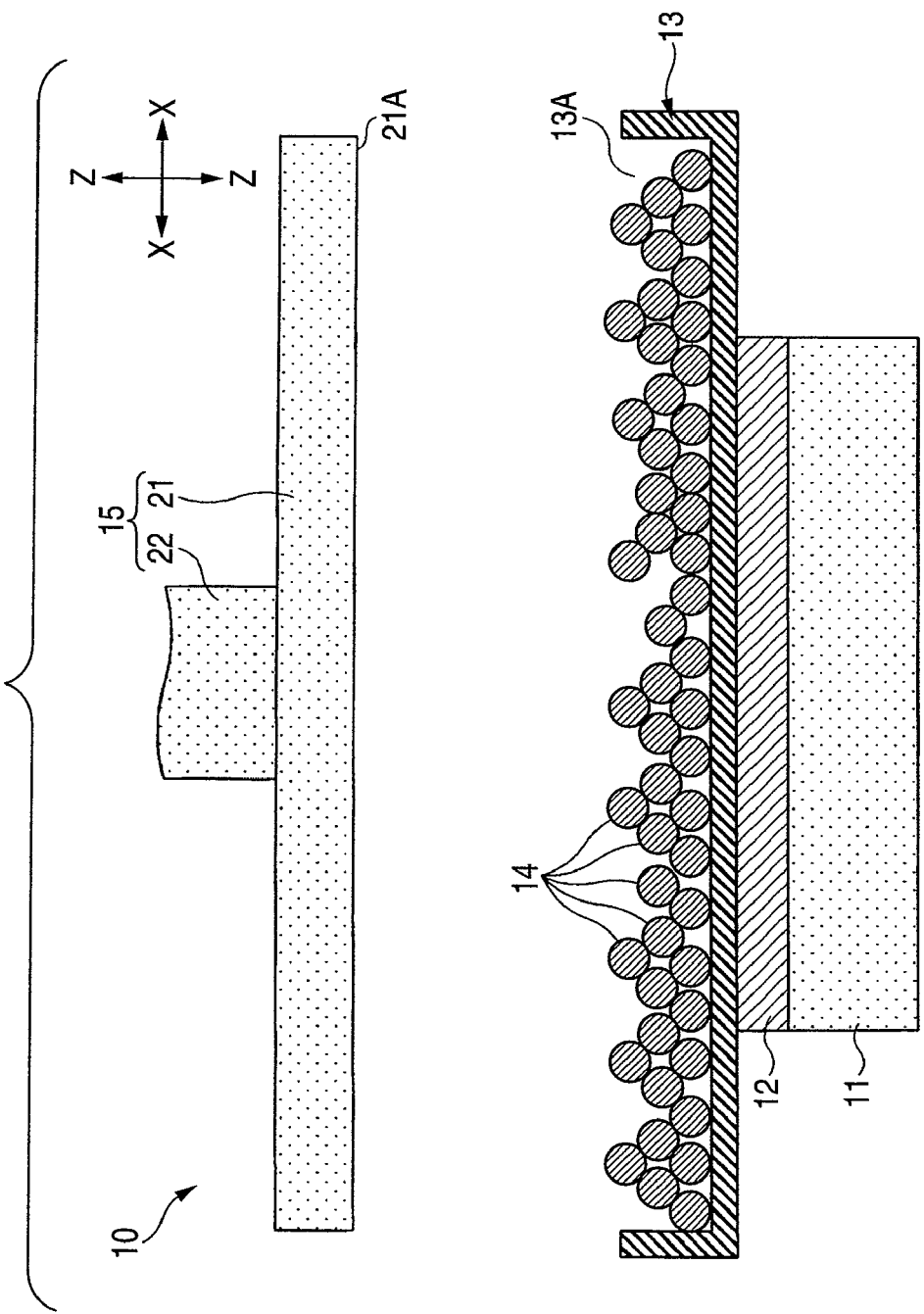
FIG. 9 is a step view (#2) describing the conductive ball mounting method using the conductive ball mounting apparatus according to the first embodiment of the present invention.

At first, in steps shown in FIG. 8, the substrate 18 where the adhesive 38 is provided on a plurality of pads 35 respectively is formed by the well-known approach. Then, in steps shown in FIG. 9, a plurality of conductive balls 14 are filled in the conductive ball container 13.

Figure 10:
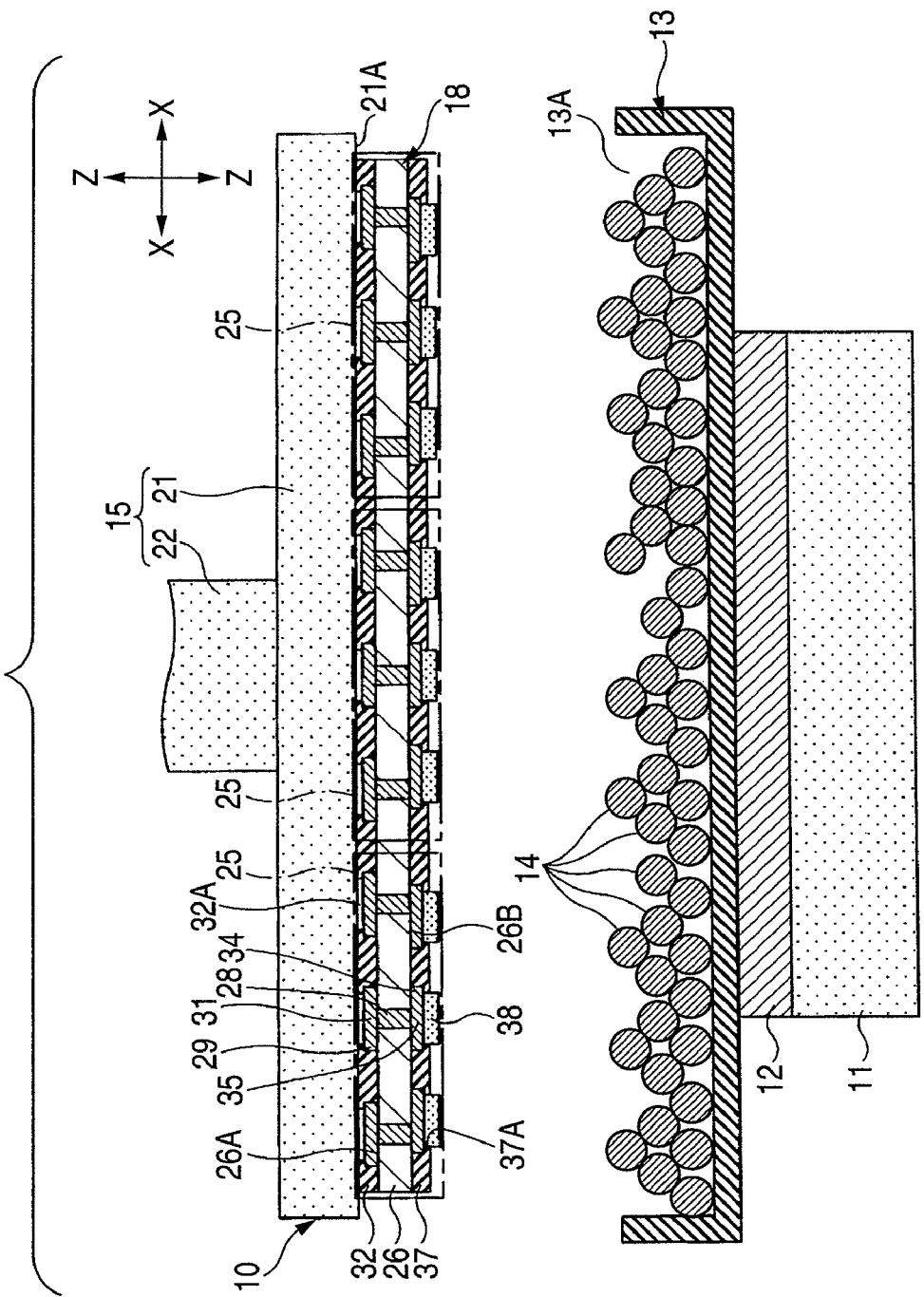
FIG. 10 is a step view (#3) describing the conductive ball mounting method using the conductive ball mounting apparatus according to the first embodiment of the present invention.

Then, in steps shown in FIG. 10, the substrate 18 is held by the substrate holding portion 21 such that the substrate 18 is disposed over the conductive ball container 13 with a space therebetween. The substrate holding portion 21 is disposed over the plurality of conductive balls 14 such that the plurality of conductive balls 14 and the plurality of pads 35 on which the adhesive 38 is provided respectively face each other (substrate disposing step).

Figure 11:
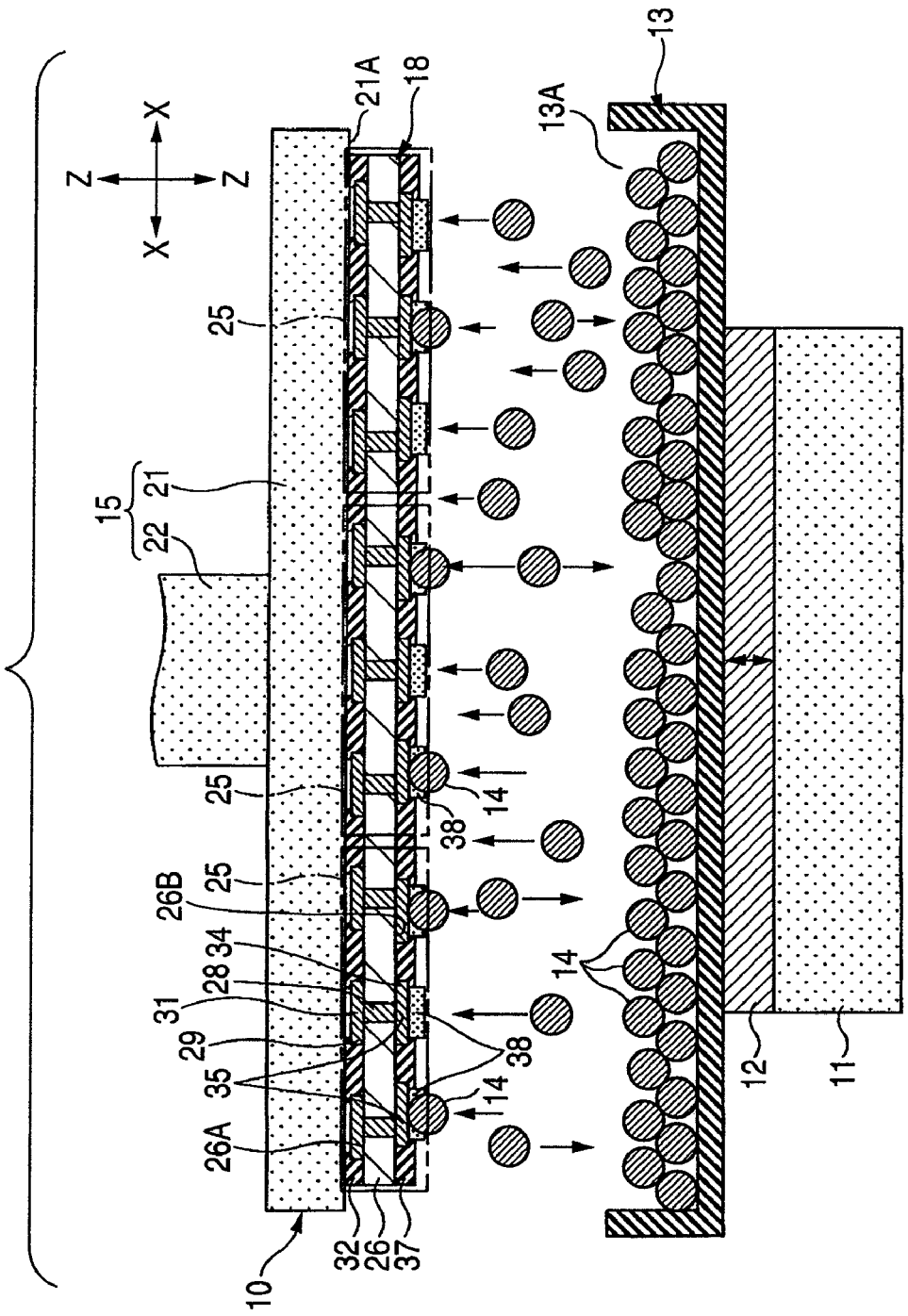
FIG. 11 is a step view (#4) describing the conductive ball mounting method using the conductive ball mounting apparatus according to the first embodiment of the present invention.

Then, in steps shown in FIG. 11, the plurality of conductive balls 14 are provided to the plurality of pads 35 by vibrating the conductive ball container 13 by means of the vibrating unit 12 to move up the plurality of conductive balls 14 contained in the conductive ball container 13 (conductive ball providing step).

Accordingly, the extra conductive balls 14, which are not disposed on the pads 35 on which the adhesive 38 is formed, out of the plurality of raised conductive balls 14 fall down on the conductive ball container 13. Therefore, the step of mounting the conductive ball 14 on the plurality of pads 35 respectively and the step of removing extra conductive balls 14 can be carried out simultaneously. As a result, a processing time required for the step of mounting the conductive ball 14 on the plurality of pads 35 respectively and the step of removing the extra conductive balls 14 can be shortened, and thus productivity can be improved.

In this case, the vibration of the conductive ball container 13 by the vibrating unit 12 is continued until the conductive ball 14 is mounted on all pads 35 respectively.

Figure 12:
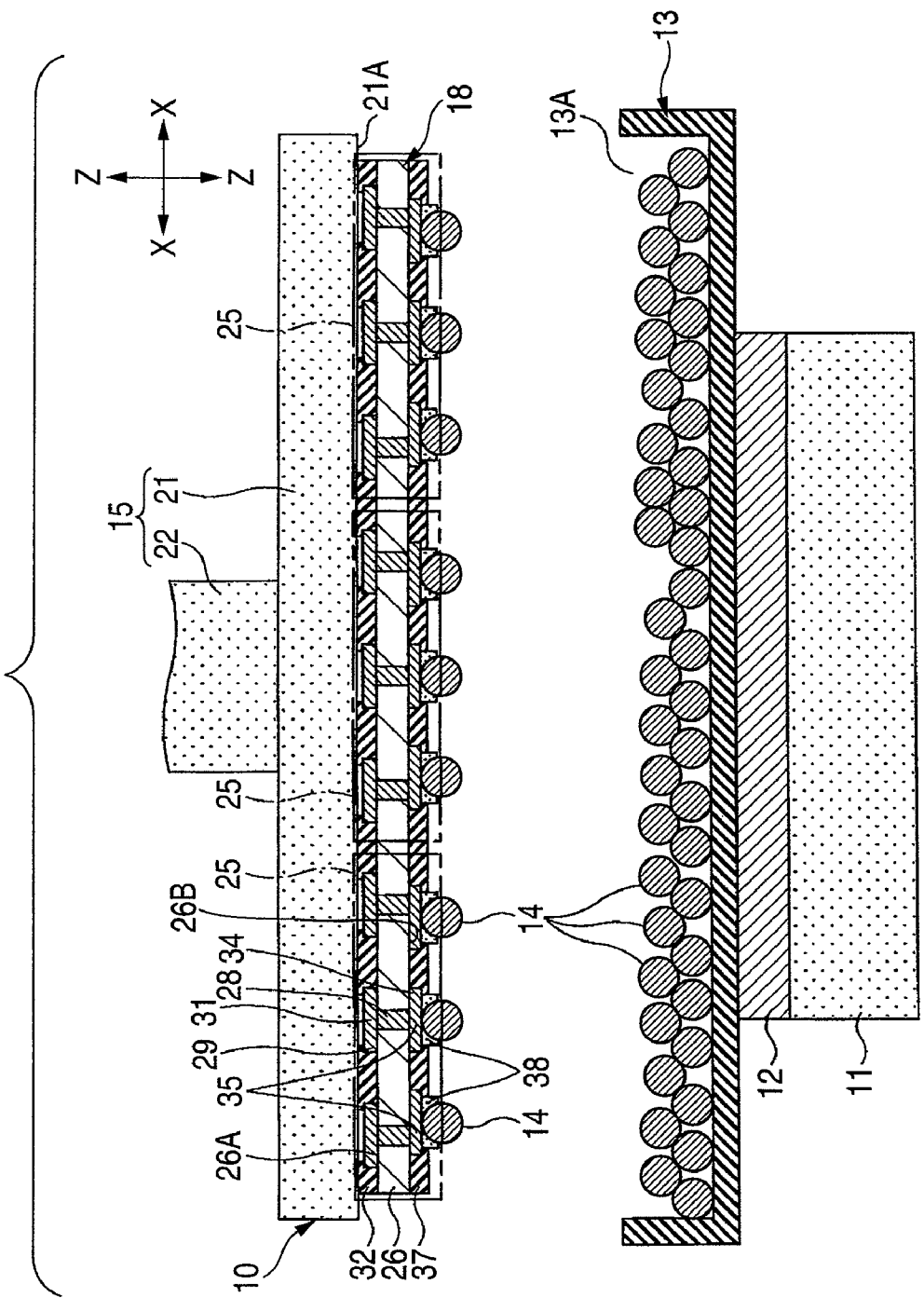
FIG. 12 is a step view (#5) describing the conductive ball mounting method using the conductive ball mounting apparatus according to the first embodiment of the present invention.

Then, in steps shown in FIG. 12, the vibration of the conductive ball container 13 by the vibrating unit 12 is stopped after the conductive ball 14 is mounted on all pads 35 respectively.

Figure 13:
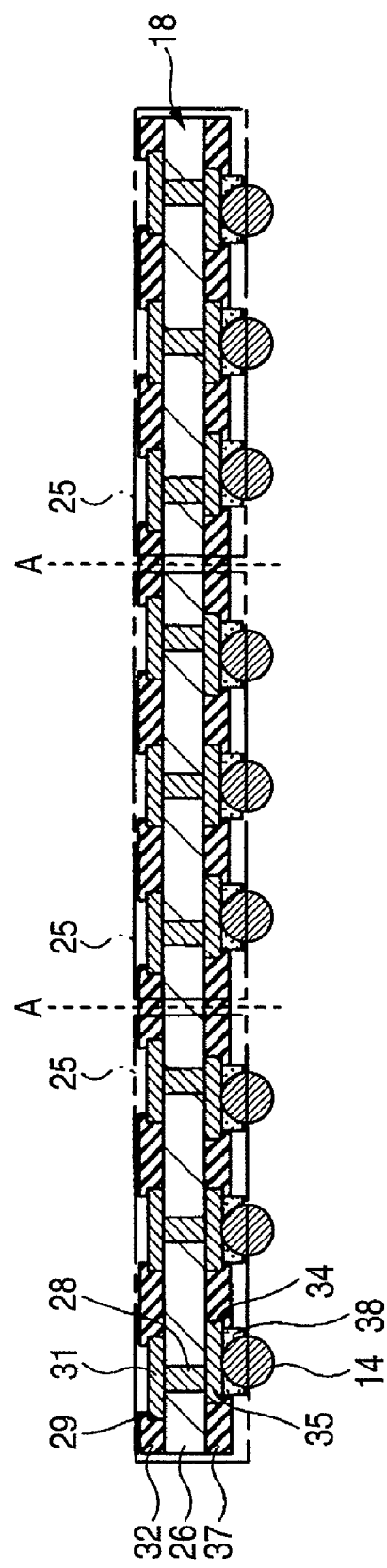
FIG. 13 is a step view (#6) describing the conductive ball mounting method using the conductive ball mounting apparatus according to the first embodiment of the present invention.

Then, in steps shown in FIG. 13, the substrate 18 on which the conductive balls 14 are mounted is released from the substrate holding portion 21. Then, the conductive balls 14 and the pads 35 are joined together by heating a structure shown in FIG. 13, and then the adhesive 38 is cleaned.

Figure 14:
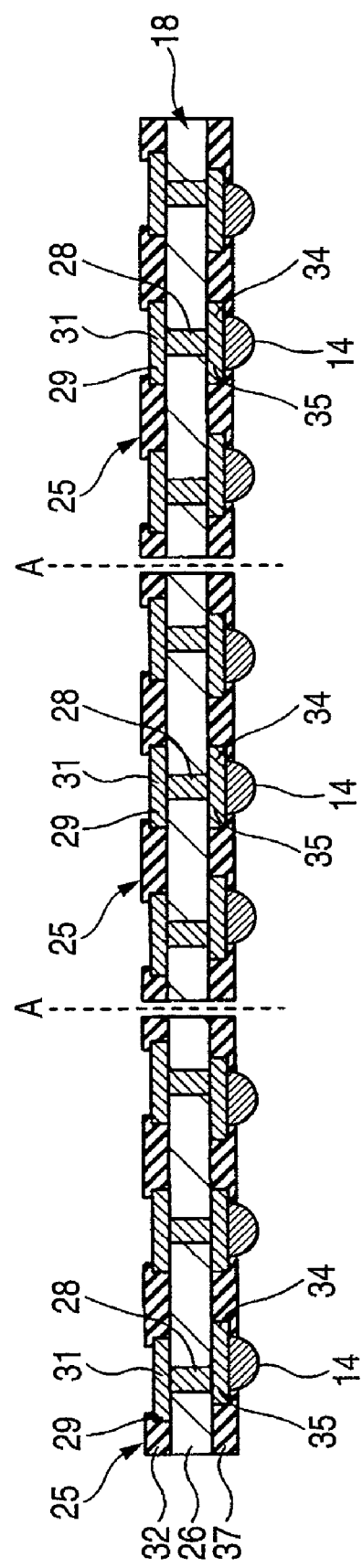
FIG. 14 is a step view (#7) describing the conductive ball mounting method using the conductive ball mounting apparatus according to the first embodiment of the present invention.

Then, in steps shown in FIG. 14, the structure shown in FIG. 13 is cut along the cut position A. As a result, a plurality of substrates 25 having the conductive balls 14 are formed.

According to the conductive ball mounting method of the present embodiment, the plurality of conductive balls 14 are moved up to the lower side of the substrate 18 being held such that the plurality of conductive balls 14 and a plurality of pads 35 on which the adhesive 38 is provided respectively face each other. Thus, the extra conductive balls 14, which are not disposed on the pads 35 on which the adhesive 38 is formed, out of the plurality of raised conductive balls 14 fall down on the conductive ball container 13. Therefore, the step of mounting the conductive ball 14 on the plurality of pads 35 respectively and the step of removing extra conductive balls 14 can be carried out at the same time. As a result, a processing time required for the step of mounting the conductive ball 14 on the plurality of pads 35 respectively and the step of removing the extra conductive balls 14 can be shortened, and thus productivity can be improved.

In the present embodiment, the case where the vibrating unit 12 is used as the conductive ball supplying unit is described by way of example. But any means may be employed as the conductive ball supplying unit if such means can move up the plurality of conductive balls 14. For example, in place of the vibrating unit 12, an air supplying unit for moving up the plurality of conductive balls 14 by supplying an air may be employed.

Second Embodiment

Figure 15:
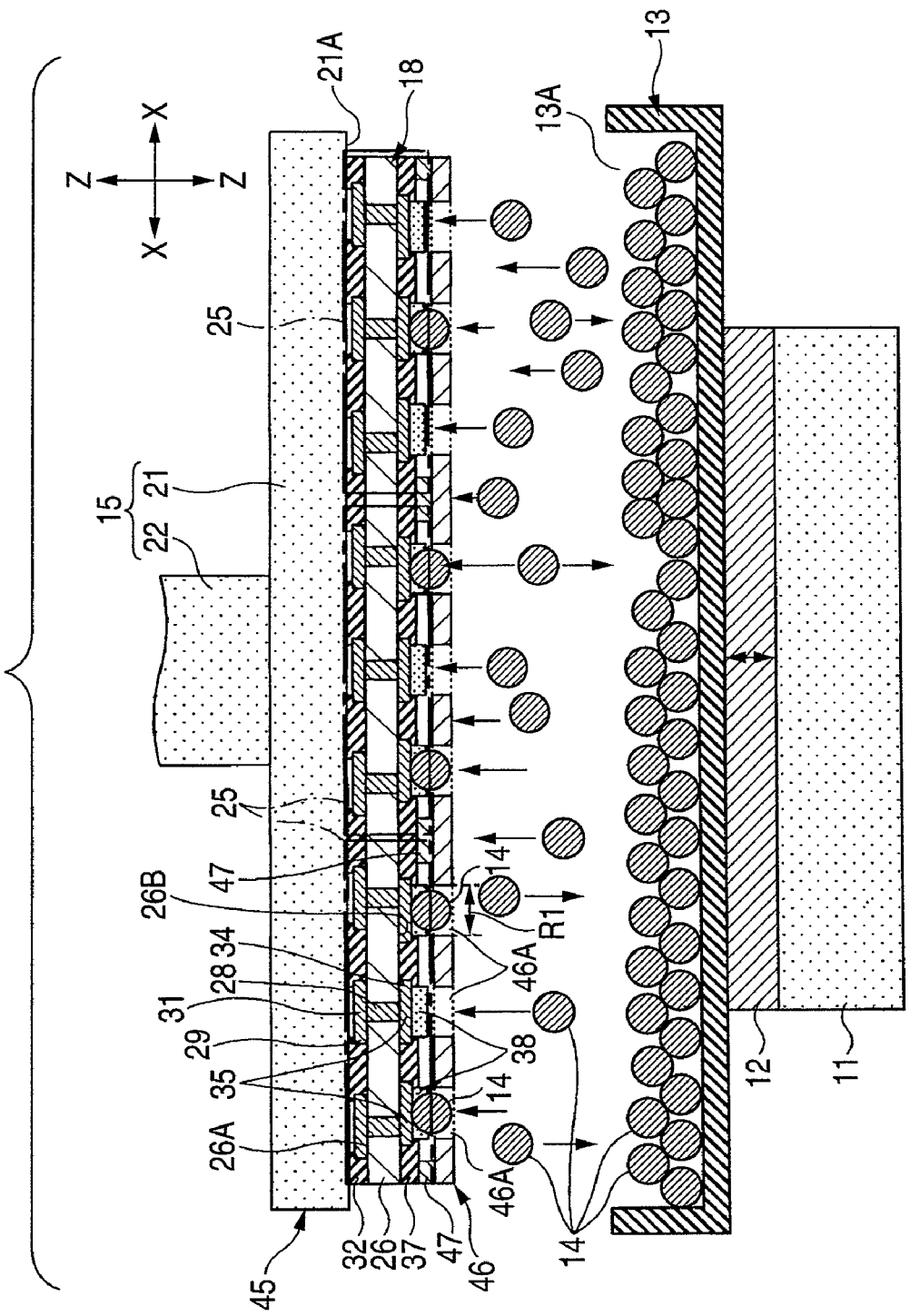
FIG. 15 is a sectional view of a conductive ball mounting apparatus according to a second embodiment of the present invention.

FIG. 15 is a sectional view of a conductive ball mounting apparatus according to a second embodiment of the present invention. In FIG. 15, such a situation is illustrated that a plurality of conductive balls 14 are moved up to the lower side of the substrate 18 held by the substrate holder 15. Also, in FIG. 15, the same reference symbols are denoted to the same constituent portions as those of the conductive ball mounting apparatus 10 in the first embodiment.

By reference to FIG. 15, a conductive ball mounting apparatus 45 of the second embodiment is constructed similarly to the conductive ball mounting apparatus 10 except that a mask 46 is provided to the configuration of the conductive ball mounting apparatus 10 in the first embodiment. Also, the mask 46 is disposed over the conductive ball container 13 with a space therebetween.

The mask 46 is fixed to the substrate 18 via a resist film 47 formed on the solder resist 37. The mask 46 has through portions 46A. A plurality of through portions 46A are formed to pass through portions, which correspond to positions where the pad 35 is formed respectively, of the mask 46. The through portions 46A are formed to expose the pads 35. A diameter R1 of the through portion 46A is set to a size through which only one conductive ball 14 can pass (a size larger slightly than a diameter of the conductive ball 14). Concretely, when a diameter of the conductive ball 14 is 100 µm, a diameter R1 of the through portion 46A can be set to 120 µm, for example. Also, the material of the mask 46, a metal may be used.

According to the conductive ball mounting apparatus of the present embodiment, the mask 46 having the plurality of through portions 46A in portions corresponding to positions where a plurality of pads 35 are formed is fixed to the substrate 18, and also a diameter R1 of the through portion 46A is set to a size through which only one conductive ball 14 can pass. Therefore, such a situation can be prevented that the plurality of conductive balls 14 are disposed on one pad 35 on which the adhesive 38 is formed.

When the conductive ball mounting apparatus 45 of the present embodiment is used, the conductive ball 14 can be mounted on the plurality of pads 35 respectively by the similar approach to the method of mounting the conductive ball 14 described in the first embodiment.

According to the conductive ball mounting method of the present invention, the mask 46 having the plurality of through portions 46A in portions corresponding to positions where the plurality of pads 35 are formed is fixed to the substrate 18, and then the plurality of conductive balls 14 are moved up. Therefore, a diameter R1 of the through portion 46A is set to a size through which only one conductive ball 14 can pass. As a result, such a situation can be prevented that the plurality of conductive balls 14 are mounted on one pad 35 on which the adhesive 38 is formed.

Also, such a situation can be prevented by using the mask 46 that the plurality of conductive balls 14 come into collision with respective portions of the substrate 18 on which the adhesive 38 is not formed. Therefore, it can be prevented that the substrate 18 is damaged on account of the collision of the conductive ball 14.

Third Embodiment

Figure 16:
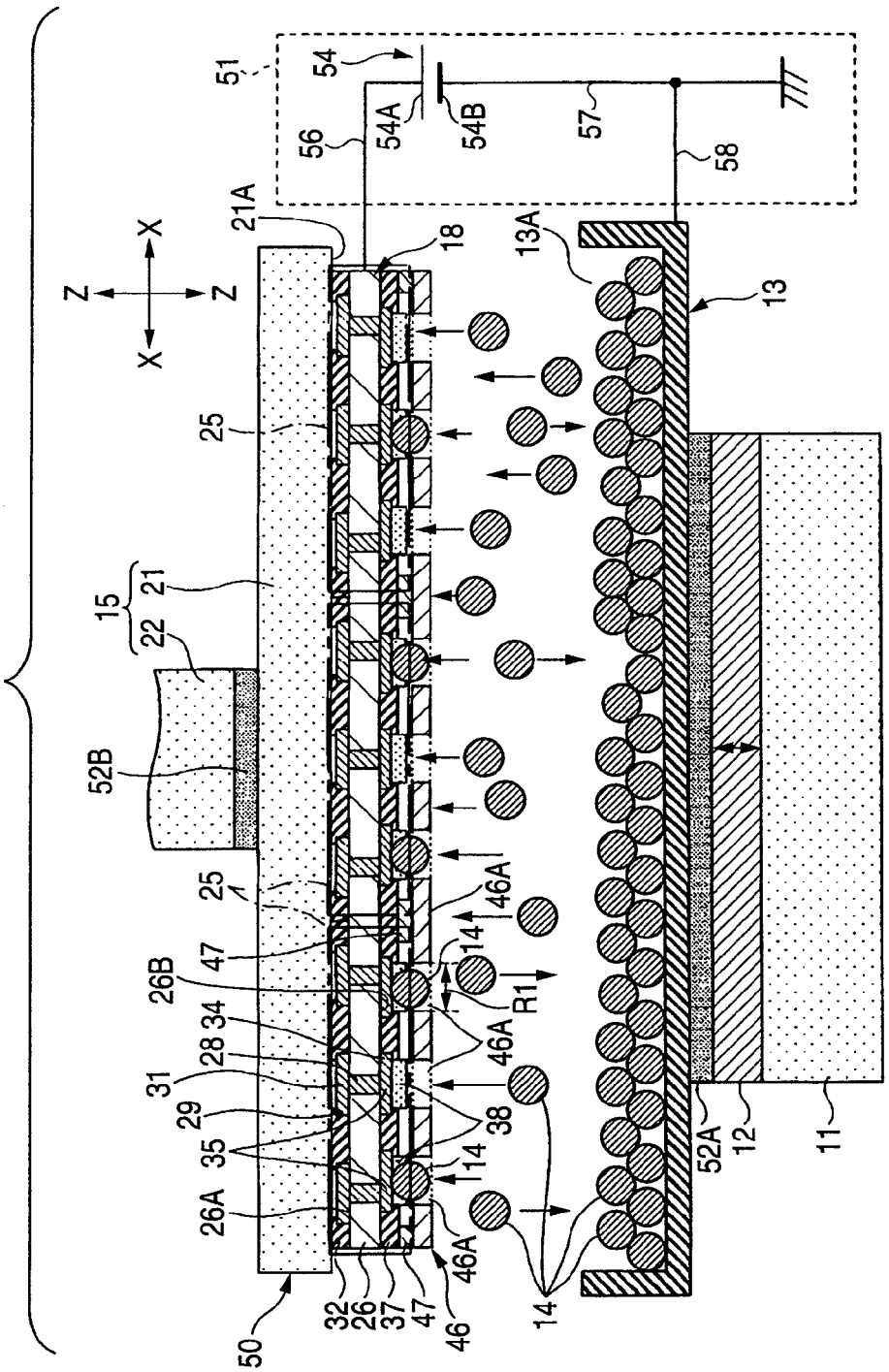
FIG. 16 is a sectional view of a conductive ball mounting apparatus according to a third embodiment of the present invention.

FIG. 16 is a sectional view of a conductive ball mounting apparatus according to a third embodiment of the present invention. In FIG. 16, such a situation is illustrated that a plurality of conductive balls 14 are moved up to the lower side of the substrate 18 held by the substrate holder 15. Also, in FIG. 16, the same reference symbols are denoted to the same constituent portions as those of the conductive ball mounting apparatus 45 in the second embodiment.

By reference to FIG. 16, a conductive ball mounting apparatus 50 according to the third embodiment is constructed similarly to the conductive ball mounting apparatus 45 except that a potential difference generating unit 51 and insulating members 52A, 52B are provided to the configuration of the conductive ball mounting apparatus 45 in the second embodiment.

The potential difference generating unit 51 has a power supply 54 and wirings 56 to 58. The power supply 54 has a plus terminal 54A and a minus terminal 54B. The plus terminal 54A is connected electrically to the substrate 18 via the wiring 56. Accordingly, the substrate 18 is set to a plus potential. The minus terminal 54B is connected to a ground via the wiring 57. Accordingly, the minus terminal 54B is set to a ground potential.

One end portion of the wiring 56 is connected to the substrate 18 whereas the other end is connected to the plus terminal 54A. One end portion of the wiring 57 is connected to the minus terminal 54B whereas the other end is connected to a ground. One end portion of the wiring 58 is connected to the wiring 57 whereas the other end is connected to the conductive ball container 13. Accordingly, the conductive ball container 13 and a plurality of conductive balls 14 contained in the conductive ball container 13 are set to a ground potential.

The potential difference generating unit 51 constructed as above is provided to generate a potential difference between the plurality of conductive balls 14 contained in the conductive ball container 13 and the substrate 18. A potential difference generated between a plurality of conductive balls 14 and the substrate 18 may be set such that an electrical attractive force generated between the plurality of conductive balls 14 and the substrate 18 by the potential difference exceeds a gravity applied to the conductive balls 14. Concretely, the potential difference generated between the plurality of conductive balls 14 and the substrate 18 may be set to several hundreds V to tens of thousands V, for example.

In this manner, the potential difference generating unit 51 for generating a potential difference between the plurality of conductive balls 14 contained in the conductive ball container 13 and the substrate 18 is provided. Thus, the plurality of moved-up conductive balls 14 are attracted to the substrate 18 by an electrical attractive force. As a result, a processing time in the step of mounting the conductive ball 14 on the plurality of pads 35 respectively can be shortened.

The insulating member 52A is provided between the vibrating unit 12 and the conductive ball container 13. The insulating member 52A is provided to make the charging of the plurality of conductive balls 14 contained in the conductive ball container 13 easy. The insulating member 52B is provided between the substrate holding portion 21 and the support 22. The insulating member 52B is provided to insulate the substrate holding portion 21 and the support 22 mutually.

According to the conductive ball mounting apparatus of the present embodiment, the potential difference generating unit 51 for generating the potential difference between the plurality of conductive balls 14 contained in the conductive ball container 13 and the substrate 18 is provided. Thus, the plurality of moved-up conductive balls 14 are attracted to the substrate 18 by an electrical attractive force. As a result, a processing time required for the step of mounting the conductive ball 14 on a plurality of pads 35 respectively can be reduced.

When the conductive ball mounting apparatus 50 of the present embodiment is used, the conductive ball 14 can be mounted on the plurality of pads 35 respectively by the similar approach to the method of mounting the conductive ball 14 in the first embodiment, except that a potential difference is generated between the plurality of conductive balls 14 contained in the conductive ball container 13 and the substrate 18 (the potential difference generating step) in the steps shown in FIG. 10 and FIG. 11 in the first embodiment.

According to the conductive ball mounting method of the present embodiment, the plurality of conductive balls 14 are moved up after a potential difference is generated between the plurality of conductive balls 14 contained in the conductive ball container 13 and the substrate 18 (the potential difference generating step). Therefore, the plurality of raised conductive balls 14 are attracted to the substrate 18 by an electrical attractive force. As a result, a processing time in the step of mounting the conductive ball 14 on the plurality of pads 35 respectively can be reduced.

In the present embodiment, the case where the plurality of conductive balls 14 contained in the conductive ball container 13 are set to a ground potential and the substrate 18 is set to a plus potential is described as an example. But the substrate 18 may be set to a ground potential and the plurality of conductive balls 14 may be set to a plus potential.

Fourth Embodiment

Figure 17:
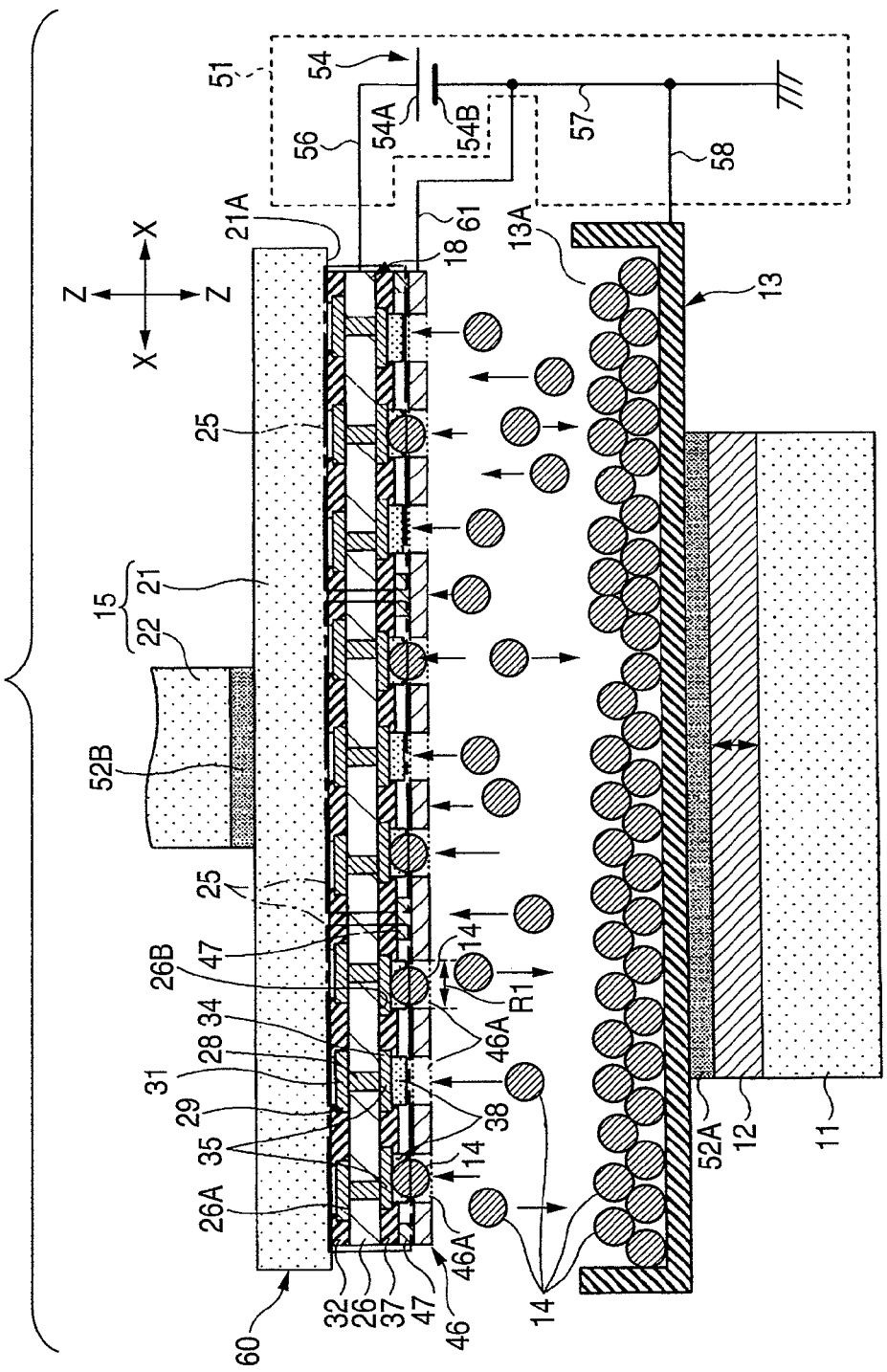
FIG. 17 is a sectional view of a conductive ball mounting apparatus according to a fourth embodiment of the present invention.

FIG. 17 is a sectional view of a conductive ball mounting apparatus according to a fourth embodiment of the present invention. In FIG. 17, such a situation is illustrated that a plurality of conductive balls 14 are moved up to the lower side of the substrate 18 held by the substrate holder 15. Also, in FIG. 17, the same reference symbols are denoted to the same constituent portions as those of the conductive ball mounting apparatus 50 in the third embodiment.

By reference to FIG. 17, a conductive ball mounting apparatus 60 of the fourth embodiment is constructed similarly to the conductive ball mounting apparatus 50 except that a charging unit 61 is further provided to the configuration of the conductive ball mounting apparatus 50 in the third embodiment. In the present embodiment, the case where a wiring is used as the charging unit 61 will be described below.

One end portion of the charging unit 61 is connected to the wiring 57 whereas the other end portion is connected to the mask 46. Accordingly, the mask 46 is set to a ground potential that is substantially equal to a potential of the plurality of conductive balls 14 contained in the conductive ball container 13.

According to the conductive ball mounting apparatus, there are provided the potential difference generating unit 51 for generating a potential difference between the plurality of conductive balls 14 contained in the conductive ball container 13 and the substrate 18 and the charging unit 61 for making a potential of the mask 46 substantially equal to a potential of the plurality of conductive balls 14 contained in the conductive ball container 13. Therefore, the plurality of moved-up conductive balls 14 are attracted to the pads 35 by an electrical attractive force. As a result, a processing time in the step of mounting the conductive ball 14 on the plurality of pads 35 respectively can be further shortened.

When the conductive ball mounting apparatus 60 of the present embodiment is used, the conductive ball 14 can be mounted on the plurality of pads 35 respectively by the similar approach to the method of mounting the conductive ball 14 in the first embodiment except that a potential difference is generated between the plurality of conductive balls 14 contained in the conductive ball container 13 and the substrate 18 (the potential difference generating step) and a potential of the mask 46 is made substantially equal to a potential of the plurality of conductive balls 14 contained in the conductive ball container 13 (the mask charging step), in the steps shown in FIG. 10 and FIG. 11 in the first embodiment.

According to the conductive ball mounting method of the present embodiment, the plurality of conductive balls 14 are moved up after a potential difference is generated between the plurality of conductive balls 14 contained in the conductive ball container 13 and the substrate 18 (the potential difference generating step) and a potential of the mask 46 is made substantially equal to a potential of the plurality of conductive balls 14 contained in the conductive ball container 13 (the mask charging step). Therefore, the plurality of moved-up conductive balls 14 are attracted to the pads 35 by an electrical attractive force. As a result, a processing time in the step of mounting the conductive ball 14 on the plurality of pads 35 respectively can be further reduced.

Fifth Embodiment

Figure 18:
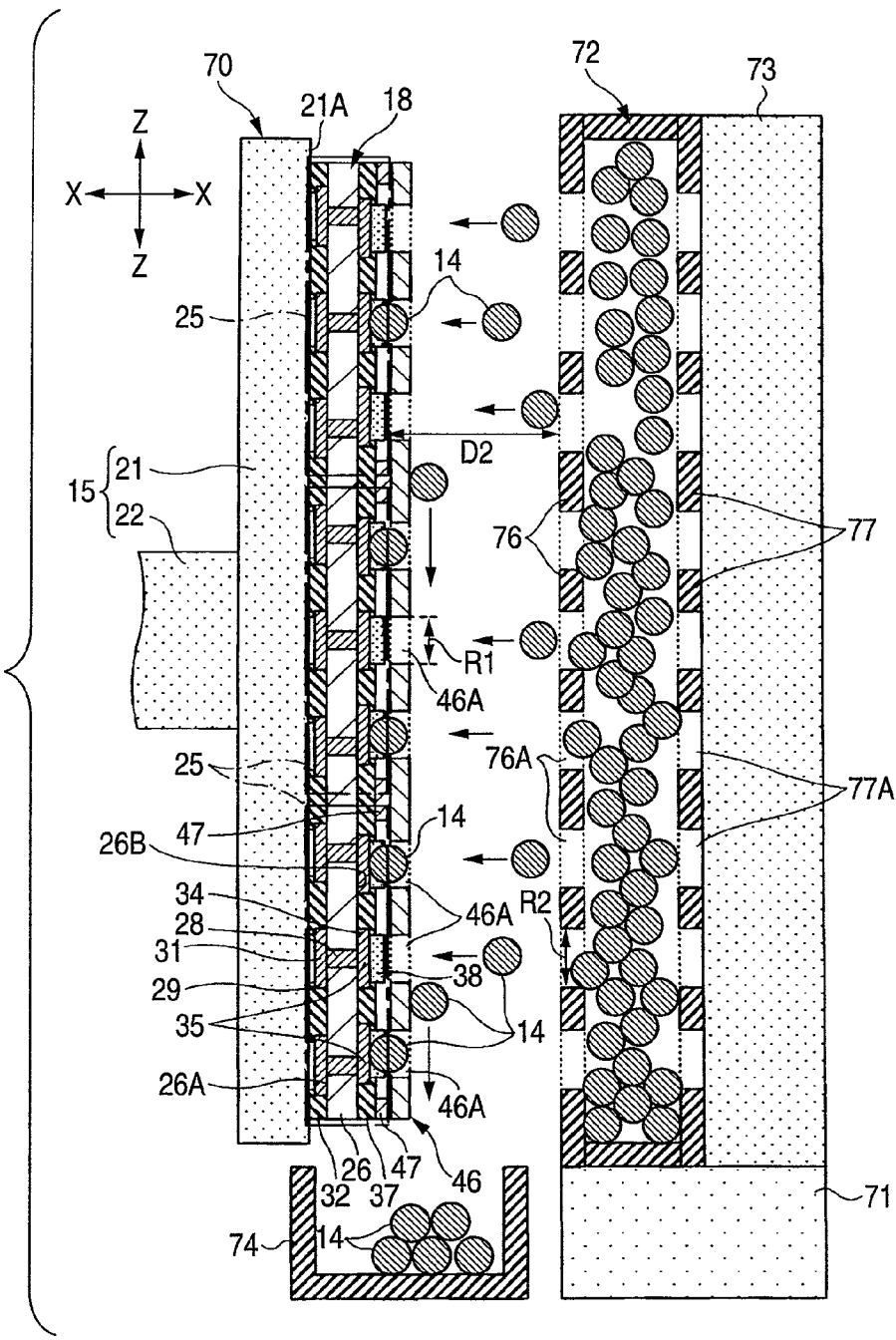
FIG. 18 is a sectional view of a conductive ball mounting apparatus according to a fifth embodiment of the present invention.

FIG. 18 is a sectional view of a conductive ball mounting apparatus according to a fifth embodiment of the present invention. In FIG. 18, such a situation is illustrated that a plurality of conductive balls 14 are sprayed to the substrate 18, on which the mask 46 is provided, from the direction that intersects orthogonally with the vertical direction (Z-direction). Also, in FIG. 18, the same reference symbols are denoted to the same constituent portions as those of the conductive ball mounting apparatus 45 in the second embodiment.

By reference to FIG. 18, a conductive ball mounting apparatus 70 of the fifth embodiment is constructed similarly to the conductive ball mounting apparatus 45, except that a supporting table 71, a conductive ball container 72, an air supplying unit 73 as the conductive ball supplying unit, and a conductive ball recovering container 74 are provided instead of the stage 11, the vibrating unit 12, and the conductive ball container 13 provided to the conductive ball mounting apparatus 45 of the second embodiment and except that the substrate 18 is held by the substrate holder 15 such that openings 76A of the conductive ball container 72 and the pads 35 face each other in a direction perpendicular to the vertical direction (Z, Z direction).

The supporting table 71 is provided to support the conductive ball container 72 and the air supplying unit 73. The conductive ball container 72 has a front plate 76 and a rear plate 77. The conductive ball container 72 is disposed such that the front plate 76 faces a plurality of pads 35. The front plate 76 has a plurality of openings 76A. The openings 76A are formed to pass through portions of the front plate 76, which face to the pads 35. When a diameter of the conductive ball 14 is 100 µm, a diameter R2 of the opening 76A may be set to 150 µm, for example. Also, a distance D2 between the front plate 76 and the adhesive 38 may be set to 1 mm, for example.

The rear plate 77 has a plurality of air introduction ports 77A. The air introduction ports 77A are formed to pass through portions, which face to the openings 76A, of the rear plate 77. The plurality of air introduction ports 77A are provided to introduce an air supplied from the air supplying unit 73 into the conductive ball container 72.

The air supplying unit 73 is provided on the supporting table 71 and contacts the rear plate 77 of the conductive ball container 72. The air supplying unit 73 is the unit that supplies an air into the conductive ball container 72 via the air introduction ports 77A. The air supplying unit 73 supplies an air into the conductive ball container 72 to spray a plurality of conductive balls 14 to the substrate 18, on which the mask 46 is provided, (concretely, the plurality of pads 35) via the openings 76A in such a manner that one conductive ball 14 is mounted on the plurality of pads 35 respectively.

The extra conductive balls 14, being not disposed on the pads 35 on which the adhesive 38 is formed respectively, out of the plurality of conductive balls 14 sprayed to the substrate 18 fall down in the vertical direction by virtue of gravity. Therefore, the step of mounting the conductive ball 14 on the plurality of pads 35 respectively and the step of removing the extra conductive balls 14 can be performed at the same time. As a result, a processing time required for the step of mounting the conductive ball 14 on the plurality of pads 35 respectively and the step of removing the extra conductive balls 14 can be shortened, and productivity can be improved.

The conductive ball recovering container 74 is disposed below the substrate 18. An upper end portion of the conductive ball recovering container 74 is open. The conductive ball recovering container 74 is provided to recover the extra conductive balls 14 that are not disposed on the pads 35 and fall down in the vertical direction by virtue of gravity. In this manner, the recovered conductive balls 14 can be reused by providing the conductive ball recovering container 74.

According to the present embodiment, the conductive ball mounting apparatus includes: the conductive ball container 72 for containing the plurality of conductive balls 14 and having the plurality of openings 76A to supply the plurality of conductive balls 14; the substrate holder 15 for holding the substrate 18 such that the openings 76A of the conductive ball container 72 and the pads 35 face each other in a direction perpendicular to the vertical direction (Z direction); and the air supplying unit 73 for spraying the plurality of conductive balls 14 to the plurality of pads 35. Therefore, the extra conductive balls 14, which are not disposed on the pads 35 on which the adhesive 38 is formed respectively, out of the plurality of conductive balls 14 sprayed to the substrate 18 fall down in the vertical direction by virtue of gravity. As a result, the step of mounting the conductive ball 14 on the plurality of pads 35 respectively and the step of removing the extra conductive balls 14 can be carried out simultaneously.

Accordingly, a processing time required for the step of mounting the conductive ball 14 on the plurality of pads 35 respectively and the step of removing the extra conductive balls 14 can be shortened, and productivity can be improved.

When the conductive ball mounting apparatus 70 of the present embodiment is used, the conductive ball 14 can be mounted on the plurality of pads 35 respectively by the similar approach to the method of mounting the conductive balls 14 described in the first embodiment, except that the plurality of conductive balls 14 are supplied to the substrate 18 by an air supplied from the air supplying unit 73 in the steps shown in FIG. 11 in the first embodiment.

According to the conductive ball mounting method of the present embodiment, the substrate 18 is held such that the openings 76A and the pads 35 face each other in a direction perpendicular to the vertical direction (Z direction), and then the plurality of conductive balls 14 are sprayed to the plurality of pads 35 by the air supplying unit 73. Therefore, the extra conductive balls 14, which are not disposed on the pads 35, out of the plurality of conductive balls 14 sprayed to the substrate 18 fall down in the vertical direction by virtue of gravity. As a result, the step of mounting the conductive ball 14 on the plurality of pads 35 respectively and the step of removing the extra conductive balls 14 can be performed at the same time.

Accordingly, a time required for the step of mounting the conductive ball 14 on the plurality of pads 35 respectively and the step of removing the extra conductive balls 14 can be reduced shorter than the related-art. As a result, productivity can be improved in the step of mounting the conductive ball 14 on the plurality of pads 35 respectively and the step of removing the extra conductive balls 14.

Also, the potential difference generating unit 51 (see FIG. 16) described in the third embodiment may be provided to the conductive ball mounting apparatus 70 of the present embodiment. In this case, the similar advantages to those of the conductive ball mounting apparatus 50 in the third embodiment can be achieved.

Here, the potential difference generating unit 51 (see FIG. 16) described in the third embodiment and the charging unit 61 (see FIG. 17) described in the fourth embodiment may be provided to the conductive ball mounting apparatus 70 of the present embodiment. In this case, the similar advantages to those of the conductive ball mounting apparatus 60 in the fourth embodiment can be achieved.

Sixth Embodiment

Figure 19:
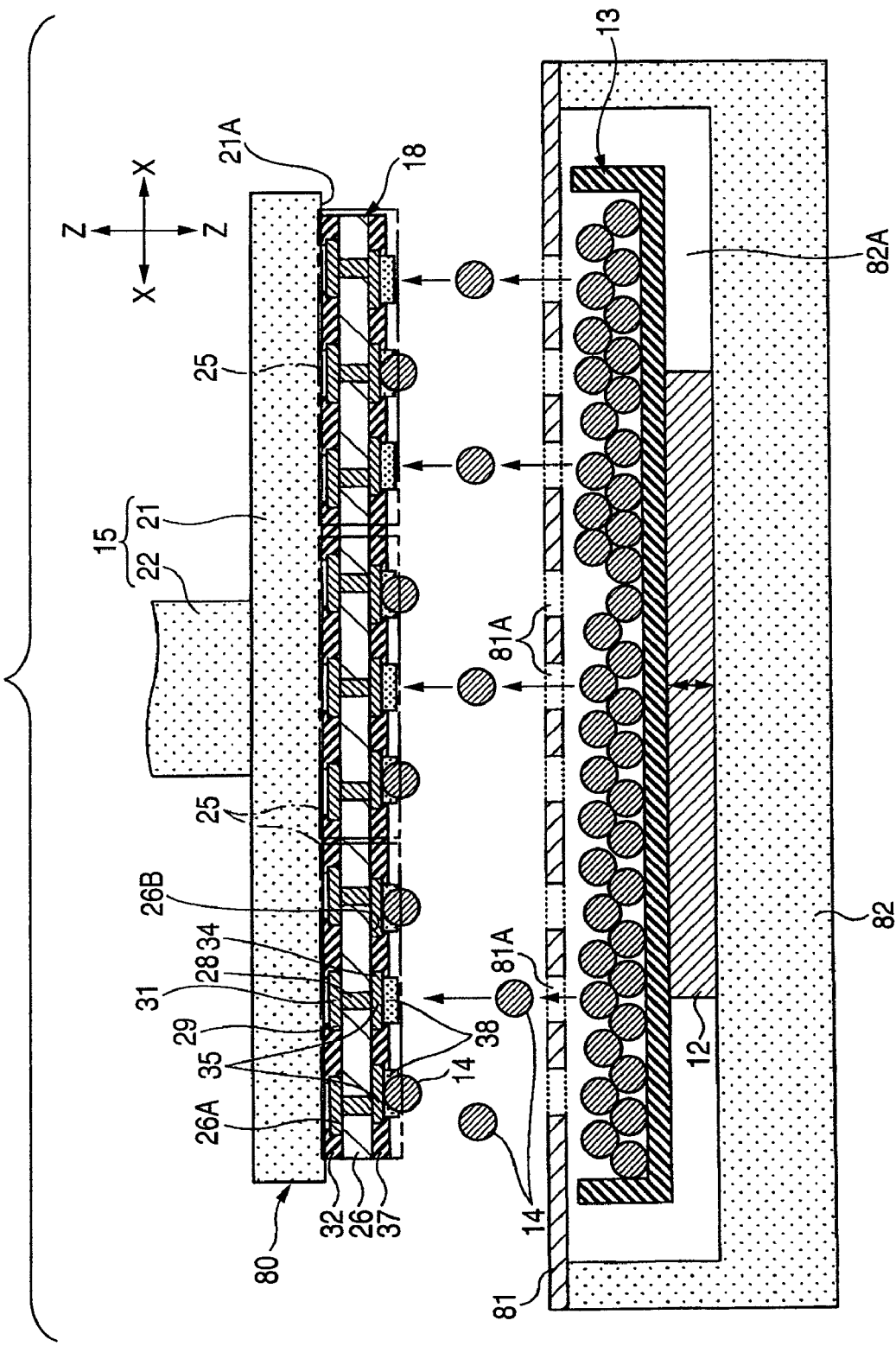
FIG. 19 is a sectional view of a conductive ball mounting apparatus according to a sixth embodiment of the present invention.

FIG. 19 is a sectional view of a conductive ball mounting apparatus according to a sixth embodiment of the present invention. In FIG. 19, such a situation is illustrated that a plurality of conductive balls 14 are moved up to the lower side of the substrate 18 held by the substrate holder 15. Also, in FIG. 19, the same reference symbols are denoted to the same constituent portions as those of the conductive ball mounting apparatus 45 in the second embodiment.

By reference to FIG. 19, a conductive ball mounting apparatus 80 of the sixth embodiment is constructed similarly to the conductive ball mounting apparatus 45, except that a plate 81 and a containing stage 82 are provided instead of the mask 46 and the stage 11 provided to the conductive ball mounting apparatus 45 in the second embodiment and except that the resist film 47 provided in the conductive ball mounting apparatus 45 is removed from the constituent elements.

The containing stage 82 has a containing portion 82A to contain the vibrating unit 12 and the conductive ball container 13 therein. The containing stage 82 contacts the lower end portion of the vibrating unit 12. The containing stage 82 supports the conductive ball container 13 via the vibrating unit 12.

The plate 81 is provided to the containing stage 82, and is disposed over the conductive ball container 13. The plate 81 has a plurality of through portions 81A. The through portions 81A are formed to pass through portions, which face to the pads 35, of the plate 81. The plate 81 having the plurality of through portions 81A is the mask used to emit the conductive balls 14 toward the adhesive 38 being formed on the pads 35 respectively. When a diameter of the conductive ball 14 is 100 μm, a diameter of the through portion 81A may be set to 120 μm, for example. As the material of the plate 81, a metal may be used.

According to the conductive ball mounting apparatus of the present embodiment, the containing stage 82 for containing the vibrating unit 12 and the conductive ball container 13 therein is provided, and also the plate 81 having the through portions 81A that emit the conductive balls 14 toward the adhesive 38 being formed on the pads 35 respectively is provided to the containing stage 82. Therefore, the conductive balls 14 can be mounted more easily than the case where the conductive ball 14 is mounted on the pads 35, on which the adhesive 38 is formed respectively, by fitting the mask 46 on the substrate 18 via the resist film 47, and also productivity can be improved in the conductive ball mounting step.

The method of mounting the conductive ball 14 of the present embodiment can be carried out by the similar approach to the method of mounting the conductive ball 14 of the second embodiment. The method of mounting the conductive ball 14 of the present embodiment can achieve the similar advantages to those of the method of mounting the conductive balls 14 in the second embodiment.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

The present invention is applicable to the conductive ball mounting apparatus and the conductive ball mounting method for mounting the conductive balls on the substrate having the plurality of pads on which an adhesive is formed thereon.

What is claimed is:

1. A method for mounting one conductive ball on each of a plurality of pads which are provided on a substrate and on which an adhesive is formed, the method comprising the successive steps of:
    providing a mask having a plurality of through portions corresponding to positions where the plurality of pads are formed;
    disposing the substrate such that a plurality of conductive balls and the plurality of pads face each other in a direction perpendicular to a gravity direction;
    generating a potential difference between the plurality of conductive balls contained in a conductive ball container and the substrate;
    charging the mask up to a potential that is substantially equal to a potential of the plurality of conductive balls contained in the conductive ball container; and
    supplying the plurality of conductive balls to the plurality of pads by spraying the plurality of conductive balls.

2. A method for mounting one conductive ball on each of a plurality of pads which are provided on a substrate and on which an adhesive is formed, the method comprising the successive steps of:
    (a) disposing the substrate over a conductive ball container for containing the plurality of conductive balls therein with a space therebetween such that the plurality of conductive balls and the plurality of pads face each other; and
    (b) supplying the plurality of conductive balls to the plurality of pads by moving up the plurality of conductive balls by vibrating the conductive ball container,
    wherein a solder resist having a plurality of openings is provided on the substrate such that each of the openings exposes a corresponding one of the pads.

3. The method of claim 2, further comprising:
    (c) providing a mask having a plurality of through portions corresponding to positions where a plurality of pads are formed, before step (a).

4. The method of claim 2, further comprising:
    (d) providing a mask having a plurality of through portions such that the mask covers an opening of the conductive ball container where the plurality of conductive balls are contained, before step (a).

5. The method of claim 3, further comprising:
    (e) generating a potential difference between the plurality of conductive balls contained in the conductive ball container and the substrate, between step (a) and step (b).

6. The method of claim 5, further comprising:
    (f) charging the mask up to a potential that is substantially equal to a potential of the plurality of conductive balls contained in the conductive ball container, between step (a) and step (b).

7. A method for mounting one conductive ball on each of a plurality of pads which are provided on a substrate and on which an adhesive is formed, the method comprising the successive steps of:
    (a) disposing the substrate such that a plurality of conductive balls and the plurality of pads face each other in a direction perpendicular to a gravity direction; and
    (b) supplying the plurality of conductive balls to the plurality of pads by spraying the plurality of conductive balls in the direction perpendicular to the gravity direction.

8. The method of claim 7, further comprising:
    (c) providing a mask having a plurality of through portions corresponding to positions where a plurality of pads are formed, before step (a).

9. The method of claim 7, further comprising:
    (d) providing a mask having a plurality of through portions such that the mask covers an opening of a conductive ball container where the plurality of conductive balls are contained, before step (a).

10. The method of claim 8, further comprising:
    (e) generating a potential difference between the plurality of conductive balls contained in a conductive ball container and the substrate, between step (a) and step (b).

* * * * *